United States Patent
Lin et al.

(10) Patent No.: US 10,950,713 B2
(45) Date of Patent: Mar. 16, 2021

(54) METHOD AND DEVICE FOR FORMING CUT-METAL-GATE FEATURE

(71) Applicant: Taiwan Semiconductor Manufacturing Co., Ltd., Hsin-Chu (TW)

(72) Inventors: Zhi-Chang Lin, Zhubei (TW); Wei-Hao Wu, Hsinchu (TW); Jia-Ni Yu, New Taipei (TW); Huan-Chieh Su, Tianzhong Township (TW); Ting-Hung Hsu, MiaoLi (TW); Chih-Hao Wang, Baoshan Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/544,196

(22) Filed: Aug. 19, 2019

(65) Prior Publication Data

US 2020/0006531 A1   Jan. 2, 2020

Related U.S. Application Data

(62) Division of application No. 16/021,344, filed on Jun. 28, 2018, now Pat. No. 10,388,771.

(51) Int. Cl.
*H01L 29/66* (2006.01)
*H01L 27/092* (2006.01)
(Continued)

(52) U.S. Cl.
CPC .. *H01L 29/66795* (2013.01); *H01L 21/31144* (2013.01); *H01L 21/76843* (2013.01);
(Continued)

(58) Field of Classification Search
CPC ....... H01L 21/823878; H01L 21/31144; H01L 29/7855; H01L 21/76843; H01L 29/66545;
(Continued)

(56) References Cited

U.S. PATENT DOCUMENTS 7,425,740 B2   9/2008   Liu et al.
7,667,271 B2   2/2010   Yu et al.
(Continued)

*Primary Examiner* — Laura M Menz
*Assistant Examiner* — Khatib A Rahman
(74) *Attorney, Agent, or Firm* — Haynes and Boone, LLP

(57) ABSTRACT

A mask layer is formed over a semiconductor device. The semiconductor device includes: a gate structure, a first layer disposed over the gate structure, and an interlayer dielectric (ILD) disposed on sidewalls of the first layer. The mask layer includes an opening that exposes a portion of the first layer and a portion of the ILD. A first etching process is performed to etch the opening partially into the first layer and partially into the ILD. A liner layer is formed in the opening after the first etching process has been performed. A second etching process is performed after the liner layer has been formed. The second etching process extends the opening downwardly through the first layer and through the gate structure. The opening is filled with a second layer after the second etching process has been performed.

20 Claims, 7 Drawing Sheets

(51) Int. Cl.
*H01L 29/423* (2006.01)
*H01L 29/78* (2006.01)
*H01L 21/311* (2006.01)
*H01L 21/8238* (2006.01)
*H01L 21/768* (2006.01)
*H01L 21/8234* (2006.01)

(52) U.S. Cl.
CPC ........ *H01L 21/823481* (2013.01); *H01L 21/823821* (2013.01); *H01L 21/823864* (2013.01); *H01L 21/823878* (2013.01); *H01L 27/0924* (2013.01); *H01L 29/4232* (2013.01); *H01L 29/66545* (2013.01); *H01L 29/785* (2013.01); *H01L 21/823437* (2013.01)

(58) Field of Classification Search
CPC ........ H01L 21/823864; H01L 29/785; H01L 29/78
See application file for complete search history.

(56) References Cited

U.S. PATENT DOCUMENTS

| | | | |
|---|---|---|---|
| 7,910,453 B2 | 3/2011 | Xu et al. |
| 8,048,723 B2 | 11/2011 | Chang et al. |
| 8,053,299 B2 | 11/2011 | Xu |
| 8,183,627 B2 | 5/2012 | Currie |
| 8,362,575 B2 | 1/2013 | Kwok et al. |
| 8,367,498 B2 | 2/2013 | Chang et al. |
| 8,377,779 B1 | 2/2013 | Wang |
| 8,399,931 B2 | 3/2013 | Liaw et al. |
| 8,415,718 B2 | 4/2013 | Xu |
| 8,440,517 B2 | 5/2013 | Lin et al. |
| 8,487,378 B2 | 7/2013 | Goto et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,629,506 B2 * | 1/2014 | Cheng ............. H01L 21/823842 257/369 |
| 8,633,516 B1 | 1/2014 | Wu et al. |
| 8,652,894 B2 | 2/2014 | Lin et al. |
| 8,680,576 B2 | 3/2014 | Ching et al. |
| 8,686,516 B2 | 4/2014 | Chen et al. |
| 8,703,565 B2 | 4/2014 | Chang et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,742,509 B2 | 6/2014 | Lee et al. |
| 8,772,109 B2 | 7/2014 | Colinge |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,826,213 B1 | 9/2014 | Ho et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,887,106 B2 | 11/2014 | Ho et al. |
| 9,105,490 B2 | 8/2015 | Wang et al. |
| 9,818,836 B1 | 11/2017 | Sung et al. |
| 10,083,874 B1 | 9/2018 | Yu et al. |
| 10,090,169 B1 * | 10/2018 | Zang ............. H01L 29/66545 |
| 10,176,995 B1 | 1/2019 | Wu et al. |
| 10,236,213 B1 * | 3/2019 | Pandey ........... H01L 21/823481 |
| 10,396,206 B2 * | 8/2019 | Jha ................ H01L 21/823821 |
| 2011/0068407 A1 | 3/2011 | Yeh et al. |
| 2013/0011983 A1 | 1/2013 | Tsai et al. |
| 2013/0285153 A1 | 10/2013 | Lee et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0183600 A1 | 7/2014 | Huang et al. |
| 2014/0217482 A1 | 8/2014 | Xie et al. |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2014/0282326 A1 | 9/2014 | Chen et al. |
| 2015/0214331 A1 | 7/2015 | Jang et al. |
| 2015/0263003 A1 | 9/2015 | Lee et al. |
| 2016/0005731 A1 | 1/2016 | Chen |
| 2016/0079115 A1 | 3/2016 | Lee et al. |
| 2016/0099245 A1 * | 4/2016 | Cheng ............. H01L 29/78 257/401 |
| 2016/0343858 A1 * | 11/2016 | Kim ............. H01L 21/823468 |
| 2017/0243760 A1 * | 8/2017 | Chao ............. H01L 21/28518 |
| 2018/0261514 A1 * | 9/2018 | Xie ............. H01L 29/517 |
| 2019/0013245 A1 | 1/2019 | Jha et al. |
| 2019/0067115 A1 * | 2/2019 | Park ............. H01L 29/66545 |

* cited by examiner

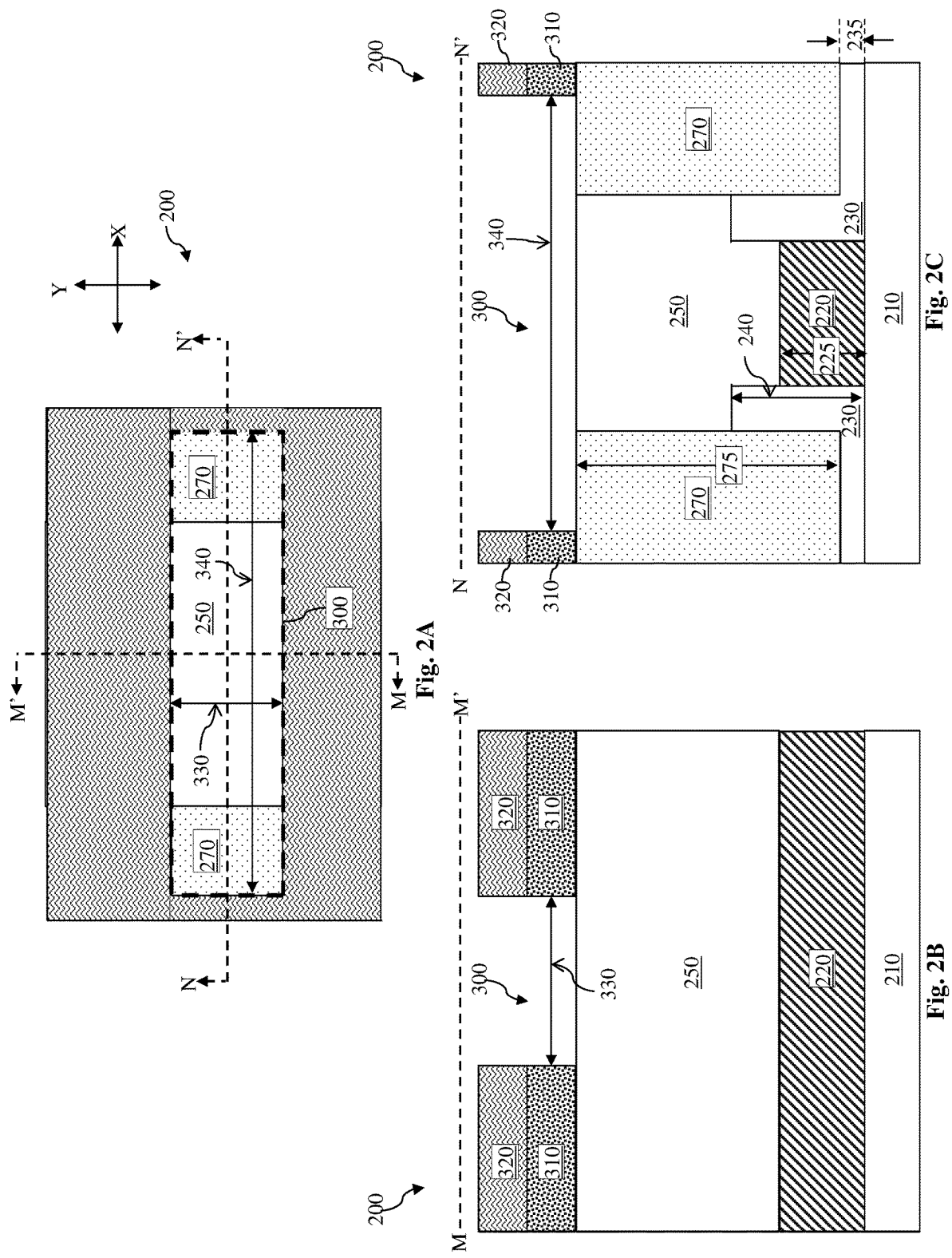

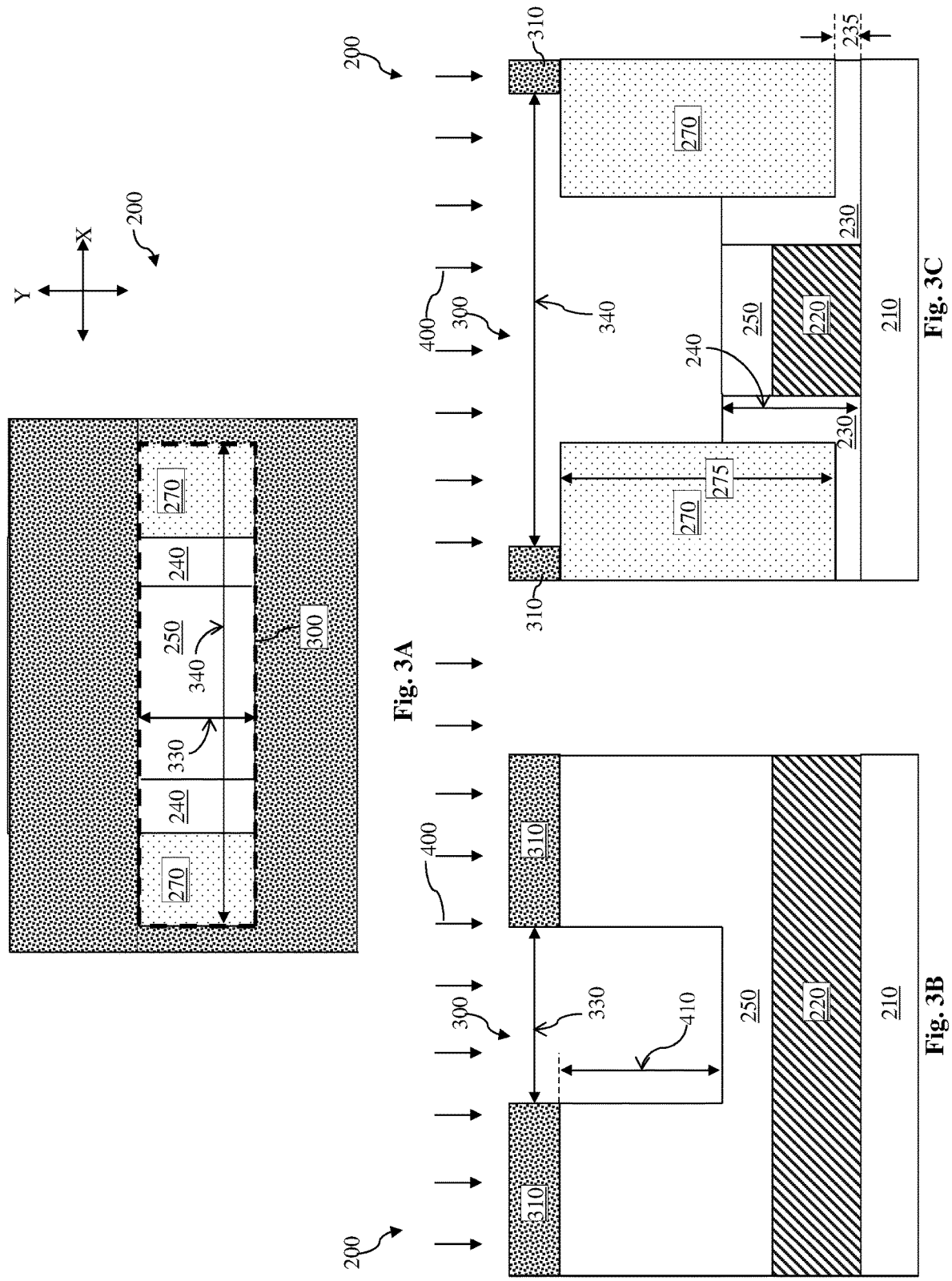

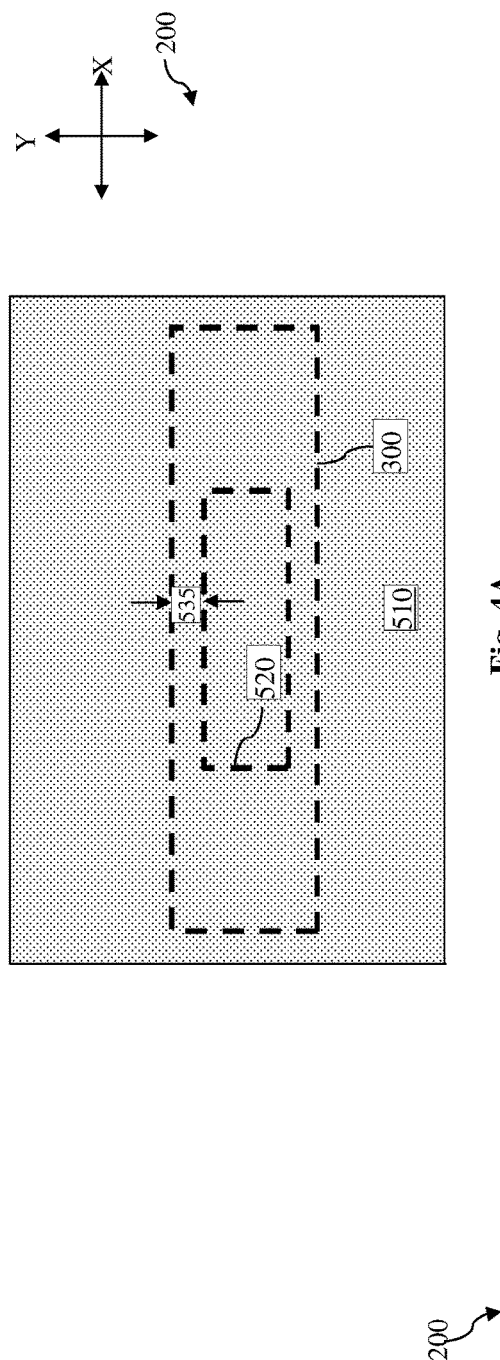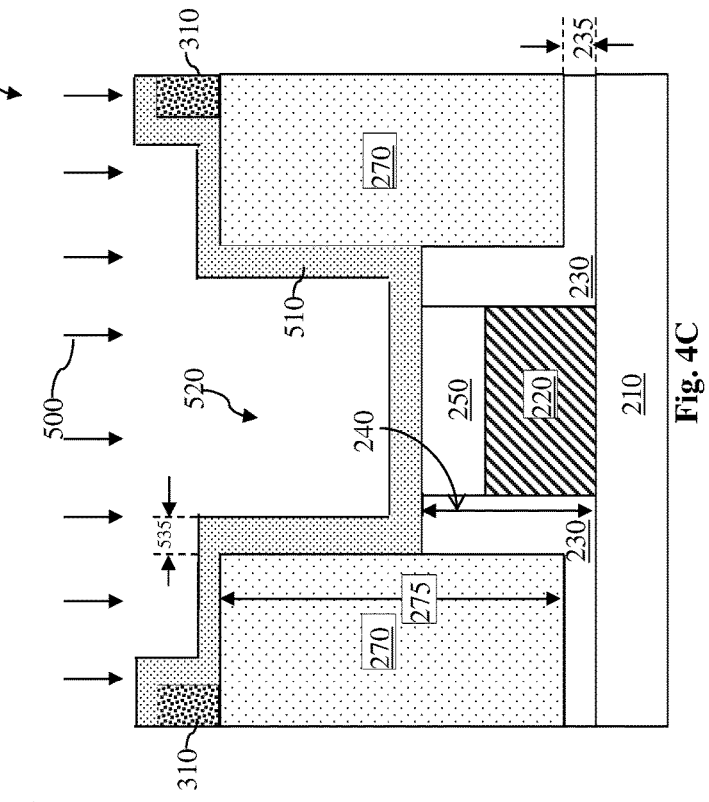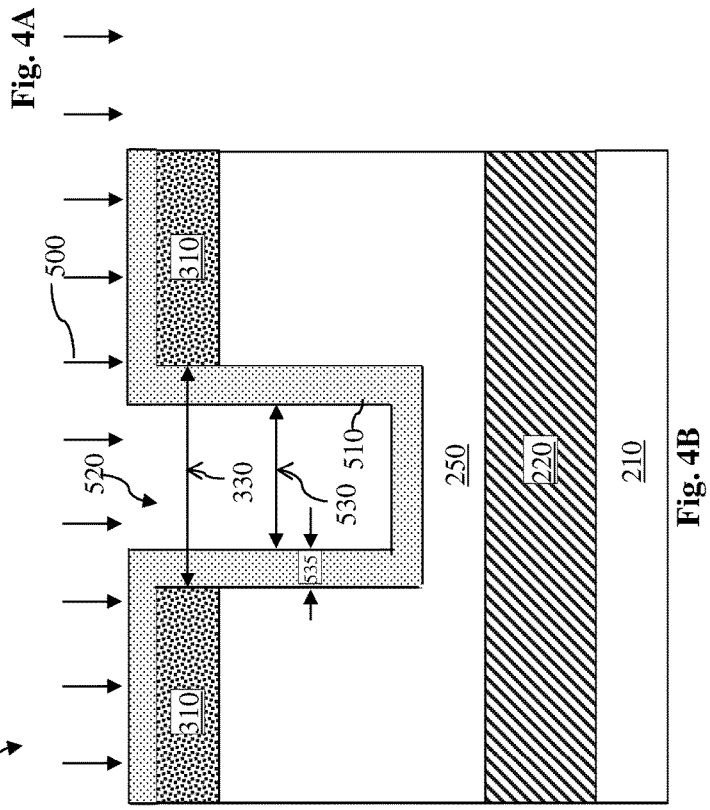

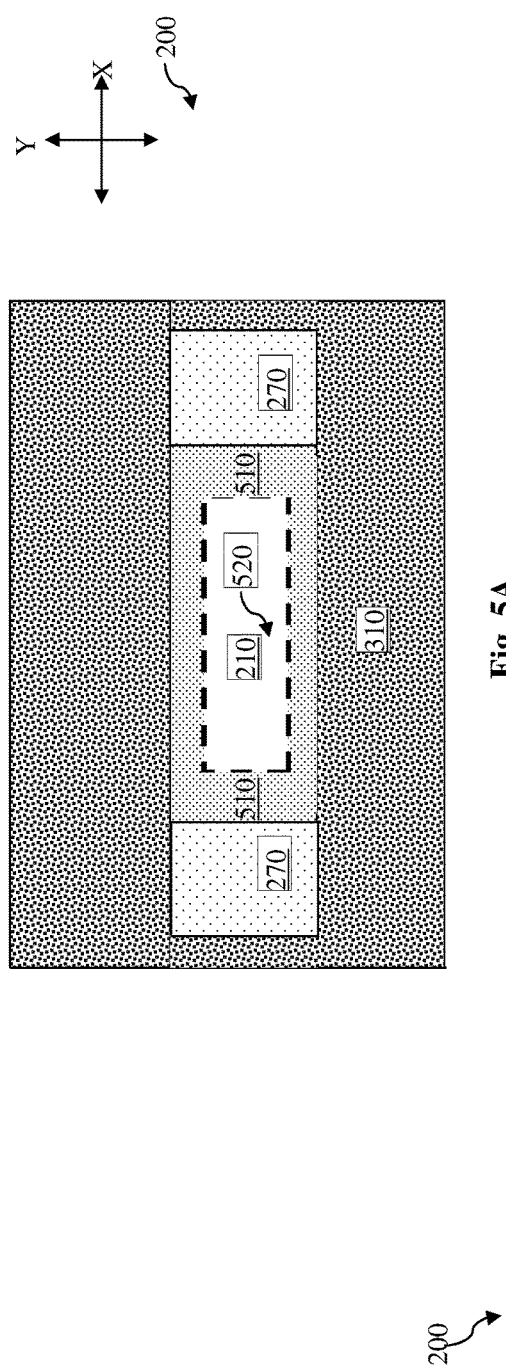
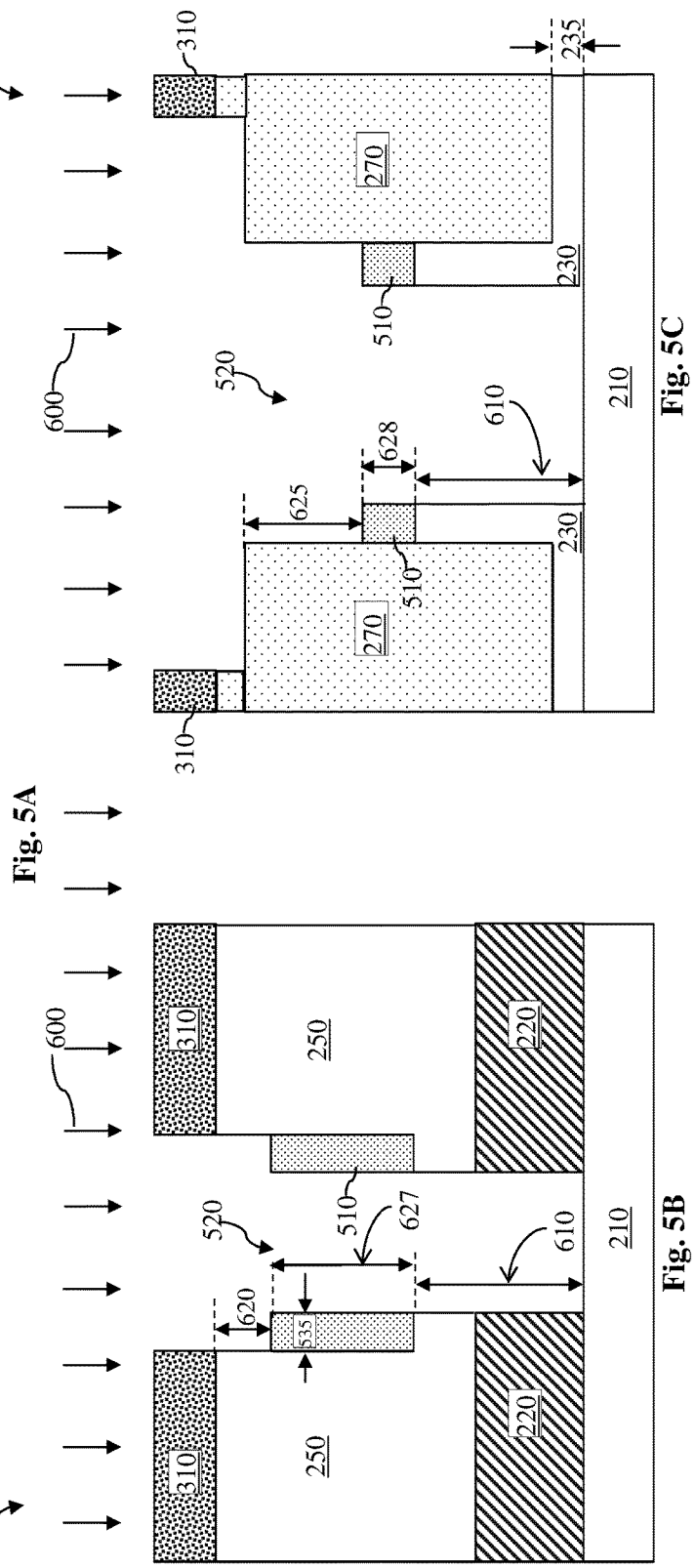

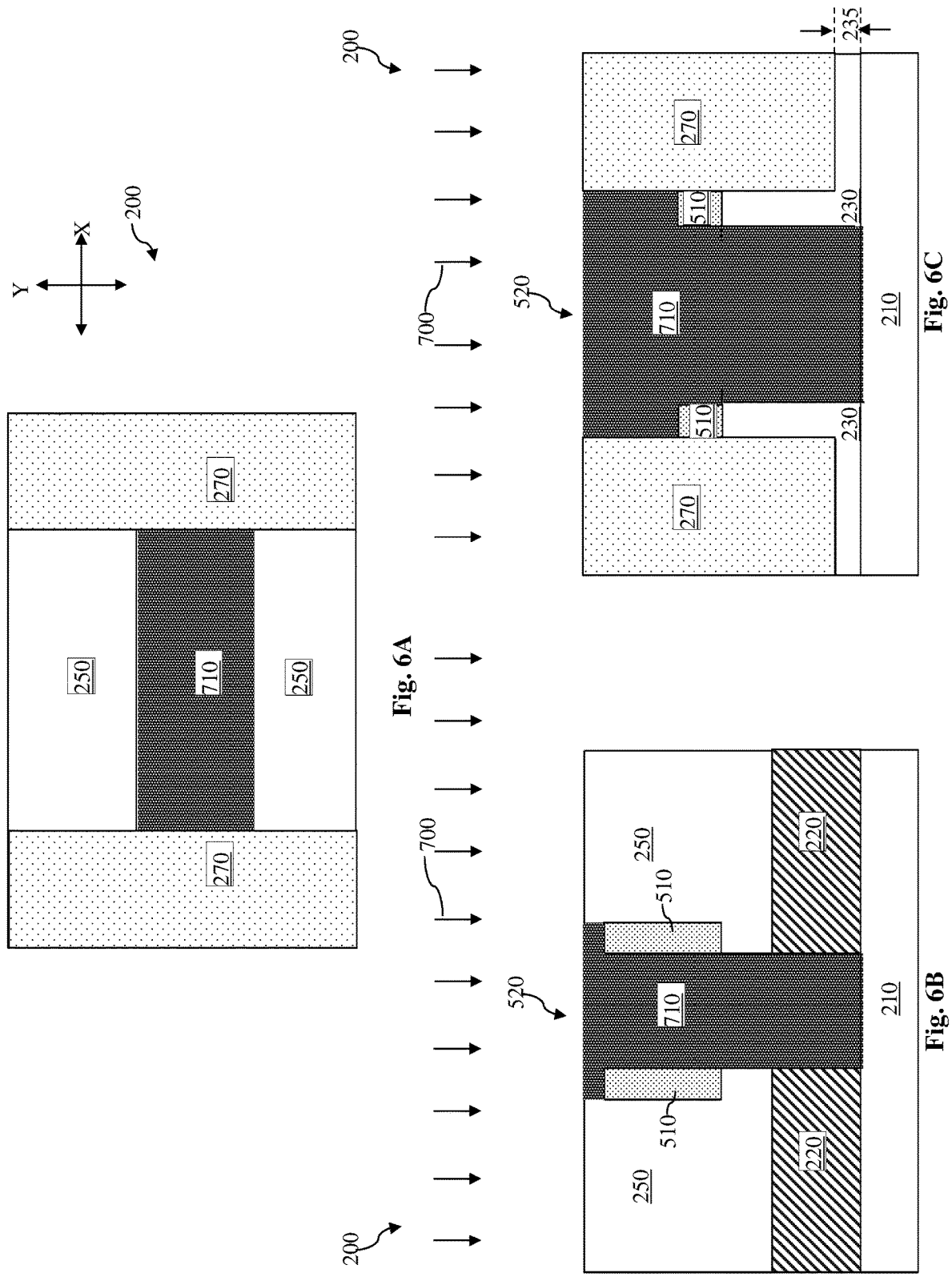

METHOD AND DEVICE FOR FORMING CUT-METAL-GATE FEATURE

PRIORITY DATA

This application is a divisional of U.S. patent application Ser. No. 16/021,344, filed Jun. 8, 2018, the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreased geometry sizes lead to challenges in semiconductor fabrication. For example, as geometry sizes continue to decrease, the smaller critical dimensions (CD) and higher aspect ratios may cause difficulties in performing etching processes. In some situations, the etching process may inadvertently or unintentional etch away an excessive amount of a layer that should not be etched. When this occurs, the result is degraded device performance or even device failures.

Therefore, while existing semiconductor devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-6A are top views of a semiconductor device at various stages of fabrication according to various embodiments of the present disclosure.

FIGS. 2B-6B are cross-sectional views of a semiconductor device at various stages of fabrication according to various embodiments of the present disclosure.

FIGS. 2C-6C are cross-sectional views of a semiconductor device at various stages of fabrication according to various embodiments of the present disclosure.

DETAILED DESCRIPTION

Figure 1:
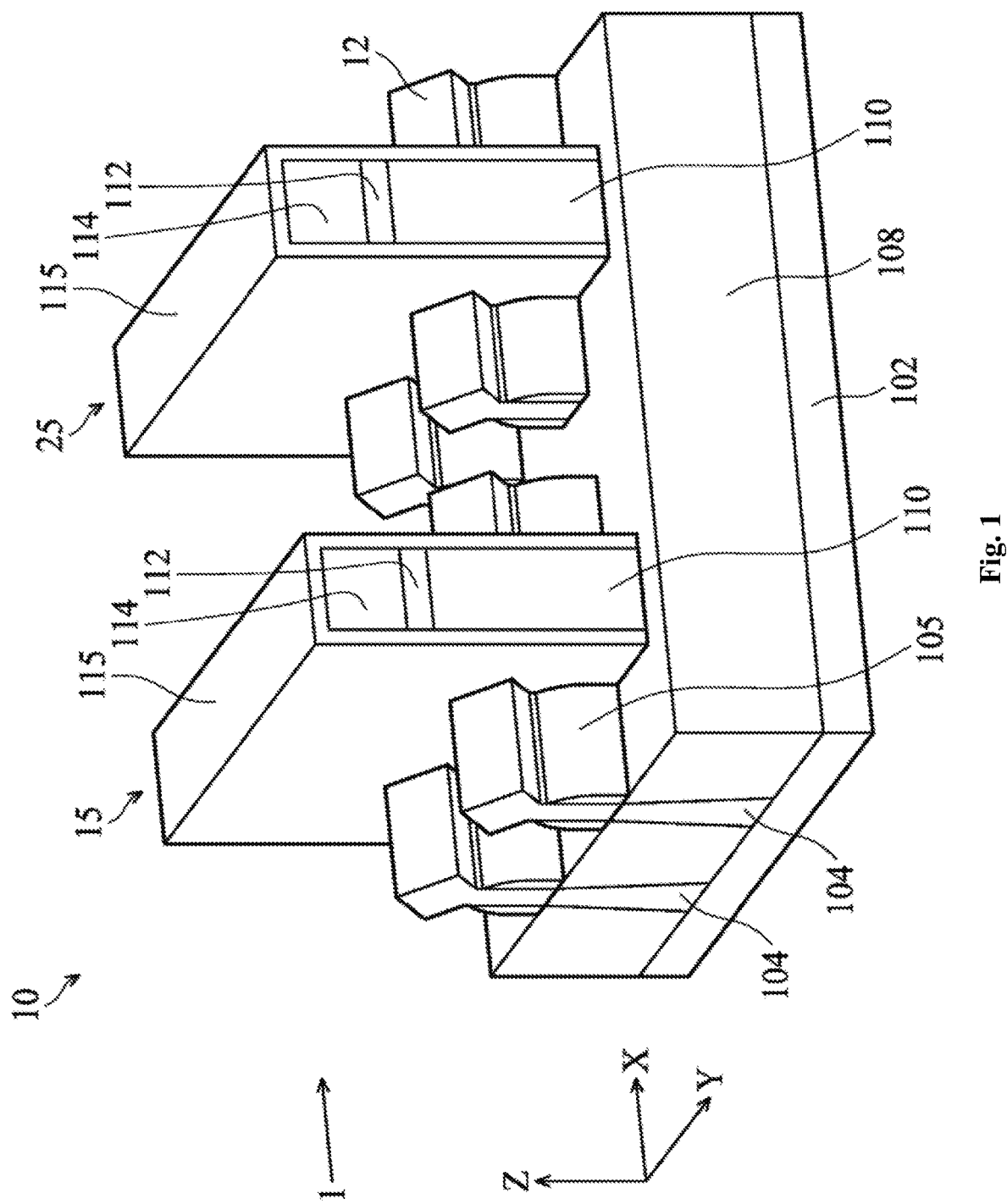
FIG. 1 is a perspective view of an example FinFET device.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a method to perform etching processes in small CD and/or high aspect ratio contexts without etching away an excessive amount of a layer that should not be etched. To illustrate the various aspects of the present disclosure, a FinFET fabrication process is discussed below as an example. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure, but it is understood that the application is not limited to the FinFET device, except as specifically claimed.

Referring to FIG. 1, a perspective view of an example FinFET device 10 is illustrated. The FinFET device structure 10 includes a N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structure 104 are elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, FinFET fabrication may still have challenges. For example, to provide electrical isolation between the gate structures of adjacent FinFET devices, the fabrication of FinFET devices also involves forming an isolation structure between the gate structures. The fabrication process for forming these isolation structures may be referred to as a cut-metal-gate (CMG) process. As a part of the CMG process, an etching process needs to be performed to etch a trench between adjacent FinFET devices. As semiconductor feature sizes continue to shrink—resulting in smaller CD and higher aspect ratios—the CMG etching process may need to have a high etching bias, which could lead to an excessive loss of the interlayer dielectric (ILD) in other approaches. The excessive loss of the ILD may degrade device performance or even lead to device failures.

To reduce the excessive loss of the ILD, the present disclosure breaks up the etching process into multiple etching processes and forms an extra liner layer between the multiple etching processes. In at least one embodiment, the multiple etching processes include two etching processes. The CMG CD is initially defined to be greater, and the aspect ratio is initially low during the first etching process, which means a high etching bias is no longer needed during the first etching process. Consequently, no excessive ILD loss will occur during the first etching process. Thereafter, in comparison with other approaches, the formation of the liner layer helps to reduce the CMG CD down to a desirable size, and the second etching process can be performed with the smaller CMG CD. The second etching process may need to have a high etching bias due to the smaller CD and higher aspect ratio, but since the second etching process only needs to etch away a small amount of materials, any ILD loss caused by the high etching bias is acceptable. It is understood that what is considered to be a high etching bias may vary case by case, which may depend on factors such as etching gas composition, type of etching tool used, structures or materials being etched, type of incoming ions, isotropic or anisotropic profiles, etc. In some embodiments, an etching bias that is greater than about 200 volts may be considered high etching bias.

The various aspects of the present disclosure will now be discussed below in more detail with reference to FIGS.

2A-6A, 2B-6B, 2C-6C, and 7 below. In that regard, FIGS. 2A-6A illustrate fragmentary top views of a portion of a FinFET device 200 at various stages of fabrication, FIGS. 2B-6B illustrate fragmentary cross-sectional side views (in a Y-direction) of a portion of the FinFET device 200 at various stages of fabrication, and FIGS. 2C-6C illustrate fragmentary cross-sectional side views (in an X-direction perpendicular to the Y-direction) of a portion of a FinFET device 200 at various stages of fabrication. In more detail, the cross-sectional side views of FIGS. 2B-6B are obtained by taking a cross-sectional cut along a Y-direction cutline M-M' (shown in FIGS. 2A-6A) on the FinFET device 200, and the cross-sectional side views of FIGS. 2C-6C are obtained by taking a cross-sectional cut along an X-direction cutline N-N' (shown in FIGS. 2A-6A) on the FinFET device 200.

Referring now to FIGS. 2A, 2B, and 2C, the FinFET device 200 includes a layer 210. In some embodiments, the layer 210 includes a dielectric isolation structure, such as a shallow trench isolation (STI). In some other embodiments, the layer 210 includes a fin structure instead, which is also referred to as a hybrid fin. In embodiments where the layer 210 includes the fin structure, it is understood that such a fin structure is formed over the dielectric isolation structure such as STI.

The FinFET device 200 includes a gate structure 220 that is formed over the layer 210. The gate 220 has a height 225 measured vertically in the Z-direction. In some embodiments, the gate structure 220 includes a high-k metal gate (HKMG). The high-k metal gate may be formed in a gate replacement process, in which a dummy gate dielectric and a dummy gate electrode are replaced by a high-k gate dielectric and a metal gate electrode. A high-k dielectric material is a material having a dielectric constant that is greater than a dielectric constant of $SiO_2$, which is approximately 4. In an embodiment, the high-k gate dielectric includes hafnium oxide ($HfO_2$), which has a dielectric constant that is in a range from approximately 18 to approximately 40. In alternative embodiments, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO.

The metal gate electrode is formed over the high-k dielectric and may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure. In various embodiments, the fill metal component may contain Aluminum (Al), Tungsten (W), Copper (Cu), or combinations thereof.

The FinFET device 200 further includes spacers 230. As shown in FIG. 2C, some segments of the spacers 230 are formed on sidewalls of the gate structure 220, and other segments of the spacers 230 are formed over the upper surface of the layer 210. The spacers 230 include a dielectric material, for example, silicon nitride ($SiN_x$), silicon carbon nitride (SiCN), silicon oxynitride (SiON), silicon oxycarbide nitride (SiOCN), or combinations thereof. In some embodiments, the spacers 230 may be formed by a deposition process followed by one or more etching and polishing processes. The spacers 230 each have a thickness 235. In some embodiments, the thickness 235 is in a range between about 3 nanometers (nm) and about 15 nm. The spacers 230 also each have a height 240, which is measured in the Z-direction from an uppermost surface of the spacers 230 to a bottommost surface of the spacers 230. The height 240 is greater than the height 225 of the gate structure 220, such that an upper surface(s) of the spacers 230 is located vertically above an upper surface of the gate structure 220. In some embodiments, the height 240 of the spacers 230 is in a range between about 20 nm and about 100 nm. As discussed below, the height 240 of the spacers effectively defines an etching depth of the first etching process, since the first etching process will be stopped when the upper surfaces of the spacers 230 are reached.

The FinFET device 200 includes a layer 250 that is formed over the gate structure 220 and over portions of the spacers 230. The layer 250 may also be referred to as a self-aligned contact (SAC) layer. In some embodiments, the layer 250 includes SiN, silicon carbide (SiC), SiOCN, or a metal oxide material. It can be seen from FIG. 2C that the layer 250 has a "T" shape. In other words, a bottom middle portion of the layer 250 extends downward more than the rest of the layer 250. An alternative way to describe the T-shape of the layer 250 is that the spacers 230 have a greater height than the gate structure 220, such that the interface between the layer 250 and the spacers 230 is located above the interface between the layer 250 and the gate structure 220.

In some embodiments, the T-shape of the layer 250 is achieved by performing the following processes: a dummy gate structure is formed first, with gate spacers formed on the sidewalls of the dummy gate structure. A gate replacement process is then performed, in which the dummy gate structure is replaced by a high-k metal gate structure. An etch-back process is performed to the high-k metal gate structure and the gate spacers. The etching of the gate spacers stops when the gate spacers are reduced to the height 240. Thereafter, the high-k metal gate structure continues to be etched after the gate spacers are no longer etched, until the high-k metal gate structure is etched into the gate structure 220. The layer 250 is formed in place of the removed high-k metal gate structure and the removed gate spacers. In an alternative embodiment, the gate spacers may be etched before the high-k metal gate structure is etched. In any case, both embodiments result in the height of the spacers 230 exceeding the height of the gate structure 220. Since the layer 250 is formed on the upper surfaces of the gate structure 220 and the spacers 230, the layer 250 is formed to have a T-shape profile.

The FinFET device 200 includes an interlayer dielectric (ILD) layer 270. The ILD layer 270 is a bottommost ILD layer and may be referred to as an ILD0 layer. The ILD layer 270 is located on the sidewalls of the layer 250 on the sidewalls of the spacers 230. The ILD layer 270 is also located over portions of the spacers 230. The ILD layer 270 includes a dielectric material, for example a low-k dielectric material in some embodiments, or silicon oxide in some other embodiments. The ILD layer 270 has a height or thickness 275. In some embodiments, the thickness 275 is in a range between about 30 nm and about 200 nm. In comparison with other approaches, the present disclosure helps to prevent the excessive etching of the ILD layer 270, as discussed below in more detail.

FIGS. 2A-2C illustrate a stage of fabrication in which the CMG is defined. The top view outline or profile of the CMG is shown in FIG. 2A as an opening 300. The opening 300 is defined by a patterned hard mask layer 310, which is patterned by a patterned photoresist layer 320. For example, a hard mask material (e.g., a suitable dielectric material) is deposited over the layer 250 and the ILD layer 270, and a photoresist layer is formed (e.g., via spin coating) over the hard mask material. The photoresist layer then undergoes a lithography process, which may include one or more steps such as exposing, post-exposure baking, developing, rinsing to form the patterned photoresist layer 320. The patterned photoresist layer 320 defines the top view profile of the CMG opening 300. The hard mask material is then patterned by the patterned photoresist layer, and thus the profile of the CMG opening 300 is transferred to the hard mask layer 310.

The CMG opening 300 has a dimension 330 that is measured in the Y-direction as well as a dimension 340 that is measured in the X-direction. The dimension 330 is smaller than the dimension 340, and thus it may be said that the top view profile of the CMG opening 300 is shaped similar to a rectangle that is elongated in the X-direction. This top view profile of the CMG opening 300 facilitates the "cutting" of the gate structure 220 (which is elongated in the Y-direction in the top view) in a subsequent process.

The CMG opening 300 may be greater herein compared to other approaches. The greater size of the CMG opening 300 allows for a more relaxed etching window with reduced etching bias. In some embodiments, the greater size of the CMG opening 300 takes into account of the to-be-formed liner layer's thickness. For example, the dimension 330 exceeds the corresponding dimension of a conventional CMG opening by about double the thickness of the to-be-formed liner layer, and the dimension 340 exceeds the corresponding dimension of a conventional CMG opening by about doubled thickness of the to-be-formed liner layer. In some embodiments, the dimension 330 is in a range from about 21 nm to about 31 nm, for example about 26 nm. In comparison, the corresponding dimension (measured in the Y-direction) for a conventional CMG opening is typically less than about 15 nm in certain technology nodes, though it is understood that this number is not intended to be limiting and may vary in different technology nodes. Since the Y-direction dimension of the conventional CMG opening defines a critical dimension (CD) of the CMG feature (e.g., isolation feature to provide electrical isolation between adjacent gate structures), it may be said that the dimension 330 is equal to a sum of the CD of the CMG feature and doubled liner thickness. As such, the present disclosure effectively enlarges the CD of the CMG for the initial etching process discussed below, though the final CD of the CMG will be reduced to a more desirable size via the formation of the liner layer, as discussed below in more detail.

Referring now to FIGS. 3A, 3B, and 3C, the patterned photoresist layer 320 is removed, for example through a photoresist ashing or stripping process. Using the patterned hard mask layer 310 as a mask, an etching process 400 is performed to etch the CMG opening 300 into the layers below the patterned hard mask layer 310, until the spacers 230 are reached. In some embodiments, the etching process 400 uses a chloride/chlorine base etchant, with an etching bias of between about 50 volts and about 150 volts, and an etching time/duration of between about 100 seconds and about 300 seconds. The etching process 400 has an etching depth 410, which is the depth of the layer 250 that is etched away. The etching depth 410 is smaller compared to conventional CMG etching processes, since it is stopped when the spacers 230 are reached. In some embodiments, the etching depth 410 is in a range between about 100 nm and about 180 nm. In some embodiments, a ratio of the etching depth 410 and the thickness 275 of the ILD 270 is in a range between about 0.5:1 and about 0.9:1. This ratio range has been optimized, because if the ratio is outside of this range, then a large amount of etching may be needed to etch a small hole with a high aspect ratio. As a result, a major part of etching may need a high etching bias to achieve such a small hole, which would have made the ILD 270 suffer a large loss at its top after the etching.

An aspect ratio for this etching process 400 is defined as a ratio of the etching depth 410 and the dimension 330 (410:330), which is in a range between about 1.2:1 to about 7:1 in some embodiments. Compared to conventional CMG etching processes that may have an aspect ratio greater than about 20:1, the aspect ratio herein is substantially lower. One reason for the lower aspect ratio is the larger dimension 330 compared to conventional CMG openings. Another reason for the lower aspect ratio is the smaller etching depth 410 compared to conventional CMG openings. The lower aspect ratio, along with the greater dimension 330, relax the etching bias associated with the etching process 400, which means that the etching process 400 can be performed without causing excessive damage to the ILD layer 270. In contrast, the conventional CMG etching processes usually cause excessive damage to the ILD layer (e.g., etching away too much of the ILD layer while the CMG opening is etched downward) due to the high etching bias needed to overcome the high aspect ratio and the smaller CMG CD.

Referring now to FIGS. 4A, 4B, and 4C, a liner deposition process 500 is performed to form a liner layer 510 in the CMG opening 300 and over the exposed surfaces of the layers 250 and 270. Since the liner layer 510 partially fills in the opening 300, the opening 300 is now reduced to a smaller opening 520 having a dimension 530 measured in the Y-direction. The respective contours of the previous CMG opening 300 and the now smaller opening 520 are illustrated as broken lines in the top view of FIG. 4A for the sake of clarity.

The liner layer 510 has a thickness 535. The thickness 535 is substantially equal to the thickness 235 of the spacers 230 in some embodiments, or slightly less than (e.g., between about 80% and about 100% of) the thickness 235 in other embodiments (note that the Figures herein are not necessarily drawn in scale). The thickness 535 of the liner layer 510 is specifically configured to reduce the dimension 330 of the previous CMG opening 300 down to a size that is about equal to the CD of the eventually-formed CMG feature. Stated differently, the dimension 530 of the now-smaller CMG opening 520 is substantially equal to the desired CD of the CMG feature, which is in a range between about 10 nm and about 70 nm in various embodiments. In some embodiments, the thickness 535 is in a range between about 3 nm and about 15 nm. If the thickness 535 of the liner layer 510 is configured too thick, it may interfere with the subsequent etching process to be performed to "cut" the gate structure 220. If the thickness 535 of the liner layer 510 is configured too thin, it may not adequately serve its purposes of reduce the CD of the CMG opening and/or protect the ILD 270 from being etched in the subsequent etching process.

In some embodiments, the liner layer 510 and the spacers 230 have different material compositions. In some embodiments, the liner layer 510 and the ILD layer 270 have different material compositions. In some embodiments, the liner layer 510 and the layer 250 have different material compositions. As non-limiting examples, the liner layer 510 may include $SiO_x$, $SiN_x$, SiCN, SiON, SiOCN, $AlO_x$, $HfO_x$, $LaO_x$, $ZrO_x$, or combinations thereof.

Referring now to FIGS. 5A, 5B, and 5C, another etching process 600 is performed to further extend the CMG opening 520 vertically downward, for example through the layer 250 and through the gate structure 220. In some embodiments, the etching process 600 uses a chloride/chlorine base etchant, with an etching bias of between about 50 volts and about 150 volts, and an etching time/duration of between about 100 seconds and about 300 seconds. In other words, the CMG opening 520 now "cuts open" the gate structure 220 or severs it into two different segments.

Compared to the etching process 400, the etching process 600 has to deal with a smaller CMG opening 520 (i.e., smaller CMG CD), as well as a higher aspect ratio. This is due to the presence of the liner layer 510. Consequently, a high etching bias may be needed for the etching process 600. In other words, the etching process 600 has a greater etching bias than the etching process 400 due to a smaller CD and a higher aspect ratio. However, the total amount of materials needed to be etched away is small for the etching process 600, because the etching process only needs to be performed from the bottom segment of the liner layer 510 (right above the spacers 230).

In some embodiments, the etching depth 610 associated with the etching process 600 is in a range between about 20 nm and about 100 nm, which is substantially smaller than the thickness 275 of the ILD layer 270. Due to the small etching depth, the high etching bias of the etching process 600 is unlikely to cause significant damage to the ILD layer 270. In addition, since the liner layer 510 is located on the sidewalls of the ILD layer 270, the liner layer 510 can protect the ILD layer 270 during the etching process 600 as well. As a result of the etching process, a smaller portion of the ILD layer 270 (near the top) may be etched away by the etching process 600, which is tolerable. The top portions of the segments of the liner layer 510 located on the sidewalls of the ILD layer 270 are also etched away, resulting in a loss height 620 (loss of height for the liner 510) shown in FIG. 5B and a loss of height 625 shown in FIG. 5C. In other words, the height of the liner 510 is reduced by a vertical dimension 620 in FIG. 5B and by a vertical dimension 625 in FIG. 5C. In some embodiments, the loss of height 620 is in a range between about 20 nm and about 150 nm. The loss of height 625 is greater than the loss of height 620. This is because the liner layer 510 is etched down from the hard mask layer 310 in the cross-sectional views shown in FIGS. 4B-5B, whereas the liner layer 510 is etched down from the ILD layer 270 in the cross-sectional views shown in FIGS. 4C-5C. As a result, the height of the liner layer 510 is not the same in FIG. 5B and FIG. 5C, as the liner layer 510 is taller in FIG. 5B than in FIG. 5C. In some embodiments, the liner layer 510 may be totally consumed in FIG. 5C, even though the liner layer 510 may still remain in FIG. 5B. The remaining portion of the liner 510 has a liner height 627 as shown in FIG. 5B and a liner height of 628 as shown in FIG. 5C. In some embodiments, the liner height 627 is in a range from about 5 nm to about 100 nm, and the liner height 628 is in a range from about 0 nm to about 90 nm. In some embodiments, the liner height 628 could be totally consumed. However, the liner height 627 is sustained after the etching to ensure a small dimension (in the Y-direction) for the CMG opening 520. The small dimension is beneficial for a small Static Random Access Memory (SRAM) and logic cell footprint.

Referring now to FIGS. 6A, 6B, and 6C, one or more processes 700 are performed to form a refill material 710 in the opening 520. The processes 700 may include a deposition step followed by a polishing step. For example, the deposition step deposits the refill material 710 in the opening 520, and the polishing step (e.g., a chemical mechanical polishing, or CMP) planarizes the upper surfaces of the ILD layer 270 and the refill material 710. In some embodiments, the refill material may include an electrically insulating material, for example $SiO_x$, $SiN_x$, SiCN, SiON, SiOCN, $AlO_x$, $HfO_x$, $LaO_x$, $ZrO_x$, or combinations thereof. It is understood that the refill material 710 and the liner layer 510 may not necessarily have the same material compositions.

The refill material 710 is formed above the upper surface of the layer 210 (which could be a dummy fin), and the sidewalls of the refill material 710 are in physical contact with the sidewalls of the spacers 230, with the sidewalls of the liner layer 510, and with a portion of the sidewalls of the ILD layer 270. It may also be said that the liners 510 surround at least a portion of the refill material 710. Note that as shown in the cross-sectional views of FIG. 6B and FIG. 6C, the refill material 710 also has a T-shape cross-sectional profile. However, the T-shape cross-sectional profiles are different in FIG. 6B and FIG. 6C, due to the differences in the loss of height 620 and 625 (discussed above with reference to FIGS. 5B-5C). For example, a top portion (e.g., the portions formed over the liners 510) of the refill material 710 is thinner in FIG. 6B than a top portion of the refill material in FIG. 6C. The refill material 710 may also be referred to as the CMG feature, which as discussed above serves to provide electrical isolation between gate structures of adjacent transistors.

As discussed above, conventional CMG etching processes need to have a high etching bias because of the small CMG CD and the high aspect ratio of the CMG. However, the high etching bias causes an excessive loss of the ILD layer, as the ILD layer becomes unintentionally etched away during the CMG formation. Here, the present disclosure defines a CMG opening with larger dimensions and performs two etching processes to etch the CMG opening. The first etching process is performed while the CMG CD is larger (because of the initial CMG opening being defined with a larger CD) and a lower aspect ratio (because the first etching process does not need to etch all the way down). Thus, the first etching process does not need to have a high etching bias, which means the ILD loss is reduced. After the first etching process is performed, a liner layer is formed in the CMG opening to reduce the CMG CD down to the desired small CMG CD. The second etching process is performed thereafter. The second etching process can have a higher etching bias, but since the second etching process only needs to etch a small amount (e.g., a smaller etching depth), the high etching bias of the second etching process will not cause excessive damage to the ILD layer either. As such, the present disclosure can achieve a small CMG CD while ensuring that any ILD loss (which is undesirable) is minimal.

Figure 7:
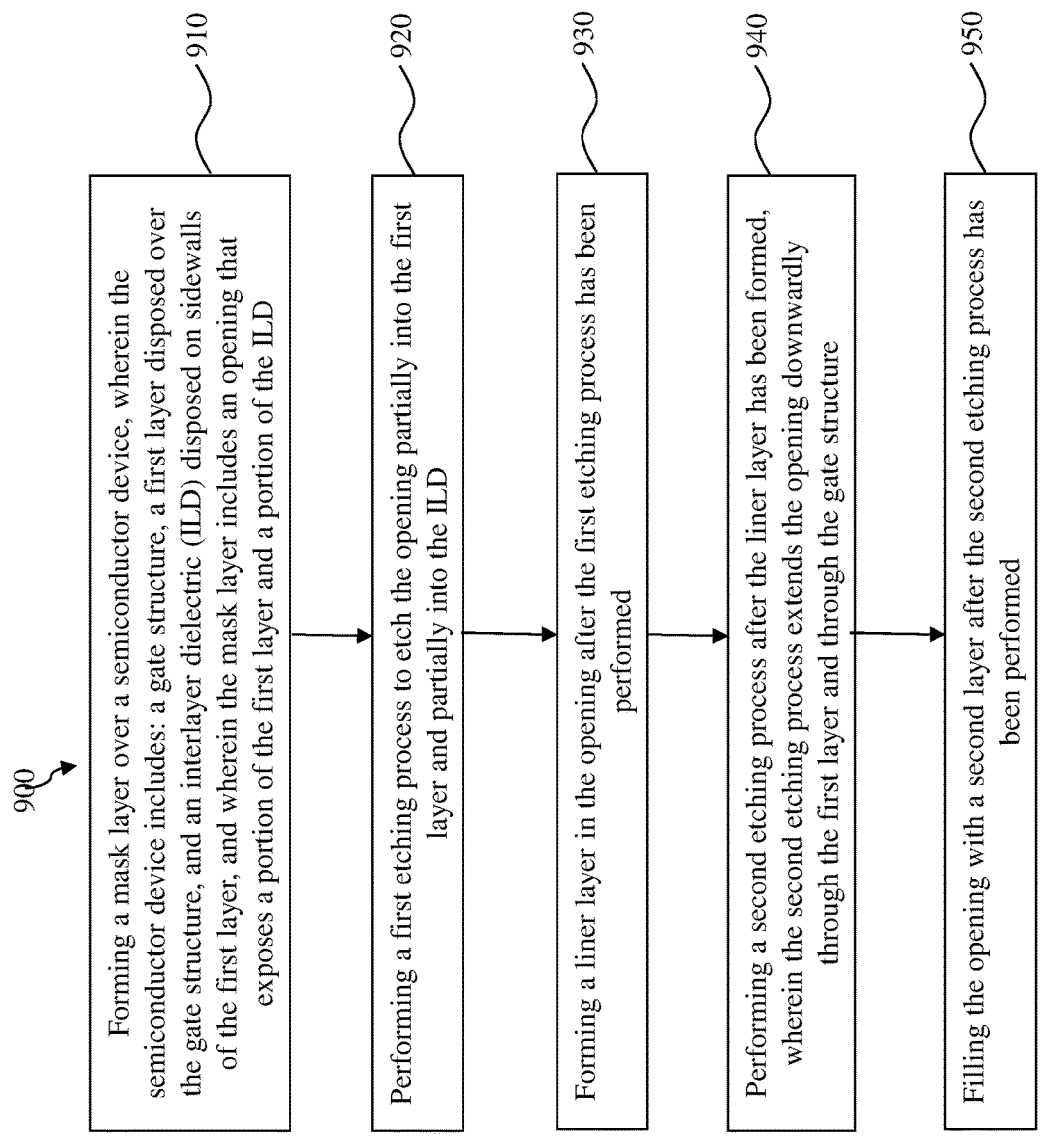
FIG. 7 is a flow chart of a method for fabricating a semiconductor device in accordance with embodiments of the present disclosure.

FIG. 7 is a flowchart of a method 900 for fabricating a semiconductor device in accordance with various aspects of the present disclosure. The method 900 includes a step 910 of forming a mask layer over a semiconductor device. In some embodiments, the semiconductor device includes a FinFET. The semiconductor device includes: a gate structure, a first layer disposed over the gate structure, and an interlayer dielectric (ILD) disposed on sidewalls of the first layer. The mask layer includes an opening that exposes a portion of the first layer and a portion of the ILD. In some embodiments, the gate structure extends in a first direction in a top view, and the opening extends in a second direction in the top view, the second direction being different from the first direction. In some embodiments, the semiconductor device further includes spacers disposed on sidewalls of the gate structure, wherein an upper surface of the spacers is located above an upper surface of the gate structure. In some embodiments, the first layer has a T-shape profile in a cross-sectional view.

The method 900 includes a step 920 of performing a first etching process to etch the opening partially into the first layer and partially into the ILD.

The method 900 includes a step 930 of forming a liner layer in the opening after the first etching process has been performed. In some embodiments, the forming the liner layer comprises forming the liner with a thickness that is equal to, or less than, a thickness of each of the spacers. In some embodiments, $SiO_x$, $SiN_x$, SiCN, SiON, SiOCN, $AlO_x$, $HfO_x$, $LaO_x$, $ZrO_x$, or combinations thereof, is formed as the liner layer.

The method 900 includes a step 940 of performing a second etching process after the liner layer has been formed. The second etching process extends the opening downwardly through the first layer and through the gate structure. In some embodiments, the second etching process removes a portion, but not all, of the liner layer. In some embodiments, the second etching process has a greater etching bias than the first etching process.

The method 900 includes a step 950 of filling the opening with a second layer after the second etching process has been performed. In some embodiments, the step 950 comprises filling the opening with an electrically insulating material as the second layer.

It is understood that additional process steps may be performed before, during, or after the steps 910-950 discussed above to complete the fabrication of the semiconductor device. For example, the method 900 may include the formation of source/drains of the semiconductor device before the step 910 is performed, and the formation of contacts/vias/metal lines after the step 950 is performed. Other steps may be performed but are not discussed herein in detail for reasons of simplicity.

Based on the above discussions, it can be seen that the present disclosure offers advantages over conventional FinFET devices and the fabrication thereof. It is understood, however, that other embodiments may offer additional advantages, and not all advantages are necessarily disclosed herein, and that no particular advantage is required for all embodiments. One advantage is that the present disclosure prevents excessive ILD loss. This is because the CMG etching process is performed in two steps: the first etching step is performed with a larger CMG CD and a lower aspect ratio, and thus the etching bias of the first etching step can be lowered compared to conventional CMG etching processes. Since the high etching bias is the culprit behind the excessive ILD loss, the lowered etching bias of the first etching step herein reduces the ILD loss during etching. When the second etching step is performed, the CMG CD is smaller, and the aspect ratio may be greater, and thus the second etching step may need a higher etching bias than the first etching step (but still lower than the etching bias of conventional CMG etching processes). Nevertheless, the second etching step still does not lead to excessive ILD loss. This is because the second etching step only needs to etch away a small amount of material (since the first etching step has already etched a substantial part of the CMG opening). As such, the ILD loss caused by the second etching step is typically acceptable. Another advantage is that the present disclosure can retain or maintain the small CMG CD needed for cutting-edge semiconductor technology nodes. For example, although a larger CMG opening is defined initially (for the first etching step), the present disclosure forms a liner layer to reduce the CMG CD down to a desirable size after the first etching step is performed and before the second etching step is performed. Hence, the second etching step can still form the CMG opening with the desired small CMG CD. Other advantages include compatibility with existing fabrication process flows, etc.

One aspect of the present disclosure involves a method of fabricating a semiconductor device. The method includes a step of forming a mask layer over a semiconductor device, wherein the semiconductor device includes: a gate structure, a first layer disposed over the gate structure, and an interlayer dielectric (ILD) disposed on sidewalls of the first layer, and wherein the mask layer defines an opening that exposes a portion of the first layer and a portion of the ILD. The method includes a step of performing a first etching process to etch the opening partially into the first layer and partially into the ILD. The method includes a step of forming a liner layer in the opening after the first etching process has been performed. The method includes a step of performing a second etching process after the liner layer has been formed, wherein the second etching process extends the opening downwardly through the first layer and through the gate structure. The method includes a step of filling the opening with a second layer after the second etching process has been performed.

One aspect of the present disclosure involves a method of fabricating a semiconductor device. The method includes a step of forming a semiconductor device that includes: a gate structure, spacers located on sidewalls of the gate structure, a first layer having a T-shape cross-sectional profile located over the gate structure, and an interlayer dielectric (ILD) located on sidewalls of the first layer and on sidewalls of the spacers, wherein an upper surface of the spacers is located above an upper surface of the gate structure. The method includes a step of forming a patterned mask layer over the semiconductor device, the patterned mask layer defining an opening that exposes a portion of the first layer and a portion of the ILD. The method includes a step of performing a first etching process to the semiconductor device to extend the opening downwardly, wherein the first etching process removes a portion of the first layer located above the upper surface of the spacers. The method includes a step of after the first etching process has been performed, forming a liner layer in the opening. The method includes a step of after the liner layer has been formed, performing a second etching process to further extend the opening downwardly through the first layer and through the gate structure, thereby severing the gate structure into two segments. The method includes a step of after the second etching process has been performed, forming an electrically insulating material in the opening.

Another aspect of the present disclosure involves a semiconductor device. The semiconductor device includes: a layer that includes a fin structure or a dielectric trench isolation feature; a first gate structure and a second gate structure disposed over the layer; spacers disposed on sidewalls of the layer, wherein upper surfaces of the spacers are located above an upper surface of the layer; liners disposed over the upper surfaces of the spacers; and an electrically insulating material disposed over the layer and between the first gate structure and the second gate structure, between the spacers, and between the liners, wherein the electrically insulating material provides electrical isolation between the first gate structure and the second gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first layer that includes a dielectric material;
   a gate structure disposed over the first layer, wherein the gate structure is elongated and extends in a first direction; and
   a dielectric structure that vertically extends into the gate structure, wherein the dielectric structure has a first T-shape profile in a first cross-sectional view taken along the first direction and a second T-shape profile in a second cross-sectional view taken along a second direction different from the first direction, wherein the dielectric structure includes a top portion and a bottom portion disposed below the top portion, the top portion having a greater lateral dimension than the bottom portion in both the first direction and in the second direction, and wherein the top portion has a more elevated bottom surface in the first T-shape profile than in the second T-shape profile.

2. The semiconductor device of claim 1, further including: liners disposed on sidewalls of the dielectric structure.

3. The semiconductor device of claim 2, wherein the liners are disposed on a portion of, but not an entirety of, the sidewalls of the dielectric structure.

4. The semiconductor device of claim 2, further including: spacers disposed on sidewalls of the dielectric structure, wherein portions of the liners are disposed over the spacers.

5. The semiconductor device of claim 2, wherein the liners and the dielectric structure have different material compositions.

6. The semiconductor device of claim 1, wherein the dielectric structure has a greater dimension in the second direction than in the first direction.

7. The semiconductor device of claim 1, further including: a self-aligned contact (SAC) layer disposed over the gate structure, wherein the dielectric structure extends vertically through the SAC layer.

8. The semiconductor device of claim 7, wherein the SAC layer contains SiN, silicon carbide (SiC), SiOCN, or a metal oxide material.

9. The semiconductor device of claim 1, wherein the dielectric structure contains: SiOX, SiNX, SiCN, SiON, SiOCN, AlOX, HfOX, LaOX, ZrOX, or combinations thereof.

10. The semiconductor device of claim 1, wherein the first layer includes a dummy fin structure or a dielectric trench isolation feature.

11. A semiconductor device, comprising:
    a first layer that includes a dummy fin structure or a dielectric trench isolation feature;
    a gate structure disposed over the first layer, wherein the gate structure extends in a first direction in a top view;
    a second layer disposed over the gate structure, wherein the second layer contains SiN, SiC, SiOCN, or a metal oxide;
    a cut-metal gate (CMG) structure that extends vertically completely through the second layer and at least partially through the gate structure, wherein the CMG structure contains an electrically insulating material and extends in a second direction in the top view, the second direction being different from the first direction; and
    liners disposed partially on sidewalls of the CMG structure, wherein a portion of the second layer separates a bottom surface of the liners from a top surface of the gate structure.

12. The semiconductor device of claim 11, wherein:
    the CMG structure has a first T-shape profile in a first cross-sectional view and a second T-shape profile in a second cross-sectional view;
    the first T-shape profile has a different appearance than the second T-shape profile; and
    the first cross-sectional view and the second cross-sectional view are taken along the first direction and the second direction, respectively.

13. The semiconductor device of claim 12, wherein: the liners have greater vertical dimensions in the first cross-sectional view than in the second cross-sectional view.

14. A semiconductor device, comprising:
    a layer that includes a fin structure or a dielectric trench isolation feature;
    a first gate structure and a second gate structure disposed over the layer in a first cross-sectional view;
    spacers disposed on sidewalls of the layer in a second cross-sectional view, wherein uppermost surfaces of the spacers are located above an upper surface of the layer;
    liners disposed over the uppermost surfaces of the spacers in the second cross-sectional view; and
    an electrically insulating material disposed over the layer and between the first gate structure and the second gate structure, between the spacers, and between the liners, wherein the electrically insulating material provides electrical isolation between the first gate structure and the second gate structure.

15. The semiconductor device of claim 14, wherein the electrically insulating material has different T-shape cross-sectional profiles in the first and second cross-sectional views.

16. The semiconductor device of claim 14, further comprising an interlayer dielectric (ILD), wherein the spacers and the liners are disposed between the ILD and the electrically insulating material.

17. The semiconductor device of claim 16, wherein the liners surround at least a portion of the electrically insulating material.

18. The semiconductor device of claim 14, wherein a thickness of the liners is equal to or less than a thickness of the spacers.

19. The semiconductor device of claim 7, wherein a sidewall of the dielectric structure is at least partially in physical contact with the SAC layer.

20. The semiconductor device of claim 1, wherein the semiconductor device is a FinFET device.

* * * * *